(12) United States Patent
Ishimoto et al.

(10) Patent No.: US 12,557,583 B2
(45) Date of Patent: Feb. 17, 2026

(54) CHIP PEELING APPARATUS AND CHIP PEELING METHOD

(71) Applicant: SAMSUNG ELECTRONICS CO., LTD., Suwon-si (KR)

(72) Inventors: Tatsuya Ishimoto, Yokohama (JP); Fumitaka Moroishi, Yokohama (JP); Masato Kajinami, Yokohama (JP)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 378 days.

(21) Appl. No.: 18/105,653

(22) Filed: Feb. 3, 2023

(65) Prior Publication Data

US 2023/0369078 A1 Nov. 16, 2023

(30) Foreign Application Priority Data

May 11, 2022 (JP) .................................. 2022-078045
Jun. 8, 2022 (KR) ......................... 10-2022-0069576

(51) Int. Cl.
*H01L 21/67* (2006.01)
*H01L 21/683* (2006.01)

(52) U.S. Cl.
CPC .. *H01L 21/67132* (2013.01); *H01L 21/67242* (2013.01); *H01L 21/6838* (2013.01)

(58) Field of Classification Search
CPC ......... H01L 21/67132; H01L 21/67242; H01L 21/6838
See application file for complete search history.

(56) References Cited

U.S. PATENT DOCUMENTS

| | | | |
|---|---|---|---|
| 9,039,867 B2 | 5/2015 | Barmettler et al. | |
| 2003/0060021 A1* | 3/2003 | Kurosawa | H01L 21/6836 438/455 |
| 2005/0067097 A1 | 3/2005 | Yamamoto et al. | |

(Continued)

FOREIGN PATENT DOCUMENTS

| | | |
|---|---|---|
| CN | 111063653 A | 4/2020 |
| JP | 7-335720 A | 12/1995 |

(Continued)

OTHER PUBLICATIONS

Translation of JP2018120983.*

(Continued)

*Primary Examiner* — Sonya M Sengupta
(74) *Attorney, Agent, or Firm* — Sughrue Mion, PLLC

(57) ABSTRACT

A chip peeling apparatus is provided that includes a housing having a seating surface for mounting a wafer, a recessed portion and a first vacuum suction hole in the seating surface, and a second vacuum suction hole, a blow hole and a protrusion in the recessed portion. The chip peeling apparatus further includes: a vacuum suction source that evacuates the first vacuum suction hole and the second vacuum suction hole; a pressure detector that detects a degree of vacuum of the second vacuum suction hole; a pressurization source that sends a fluid to the blow hole; a flow rate control valve; and a controller that determines a flow rate of the fluid to be sent to the blow hole, based on the degree of vacuum, and controls, via the flow rate control valve, the fluid sent from the pressurization source to flow at the determined flow rate.

20 Claims, 10 Drawing Sheets

(56) References Cited

U.S. PATENT DOCUMENTS

2014/0027049 A1    1/2014  Joo et al.
2019/0295878 A1    9/2019  Arai et al.
2023/0178394 A1    6/2023  Ishimoto et al.
2023/0369078 A1*  11/2023  Ishimoto ............ H01L 21/6838

FOREIGN PATENT DOCUMENTS

| | | |
|---|---|---|
| JP | 8-306711 A | 11/1996 |
| JP | 2000-353710 A | 12/2000 |
| JP | 2005-109157 A | 4/2005 |
| JP | 2010-165835 A | 7/2010 |
| JP | 4816598 B2 | 11/2011 |
| JP | 5184303 B2 | 4/2013 |
| JP | 2013-214739 A | 10/2013 |
| JP | 2014-27246 A | 2/2014 |
| JP | 2019-121775 A | 7/2019 |
| JP | 2019-169516 A | 10/2019 |
| JP | 2021-64813 A | 4/2021 |
| JP | 2023-084838 A | 6/2023 |
| KR | 10-2020-0049002 A | 5/2020 |

OTHER PUBLICATIONS

Translation of WO2013171869.*
Office Action issued on Aug. 12, 2025 by the Japanese Patent Office in corresponding JP Patent Application No. 2022-078045.
Communication issued Nov. 18, 2025 by the Korean Intellectual Property Office in counterpart Korean Patent Application No. 10-2022-0069576.

* cited by examiner

CHIP PEELING APPARATUS AND CHIP PEELING METHOD

CROSS-REFERENCE TO RELATED APPLICATIONS

This application claims priority from Japanese Patent Application No. 2022-078045, filed on May 11, 2022, in the Japanese Patent Office and Korean Patent Application No. 10-2022-0069576, filed on Jun. 8, 2022, in the Korean Intellectual Property Office, the disclosures of which are incorporated herein in their entireties by reference.

BACKGROUND

1. Technical Field

Embodiments of the present disclosure relate to a chip peeling apparatus and a chip peeling method, and more particularly, to a chip peeling apparatus and a chip peeling method used in a semiconductor manufacturing apparatus.

2. Related Art

A semiconductor mounting process may include a die bonding process in which a diced chip is peeled using a chip peeling apparatus and the peeled chip is picked up and mounted on another wafer.

A chip peeling method may include a method of pushing up the chip for every dicing tape with a sharp pin. For example, when a thin chip with a chip size of about 10 mm in width, a length of about 10 mm, and a chip thickness of 30 μm or less is pushed up, because the chip is thin and the tip of the pin is sharp, the part to be pushed up becomes the starting point and cracks or breakage occurs.

SUMMARY

According to embodiments of the present disclosure, a chip peeling apparatus and a chip peeling method are provided that solve the problem that an apparatus is complicated and occupies the device space and that the apparatus is large.

According to embodiments of the present disclosure, a chip peeling apparatus is provided. The chip peeling apparatus includes a housing including: a seating surface configured to mount a wafer; a recessed portion in the seating surface; a first vacuum suction hole in the seating surface; a second vacuum suction hole in the recessed portion, a blow hole in the recessed portion; and a protrusion in the recessed portion. The chip peeling apparatus further includes: a vacuum suction source configured to evacuate the first vacuum suction hole and the second vacuum suction hole; a pressure detector configured to detect a degree of vacuum of the second vacuum suction hole; a pressurization source configured to send a fluid to the blow hole; a flow rate control valve; and a controller configured to determine a flow rate of the fluid to be sent to the blow hole, based on the degree of vacuum detected by the pressure detector, and control, via the flow rate control valve, the fluid sent from the pressurization source to flow at the flow rate determined by the controller, wherein the controller is configured to perform a control of sending the fluid to the blow hole while vacuuming the second vacuum suction hole.

According to embodiments of the present disclosure, a chip peeling apparatus is provided. The chip peeling apparatus includes a housing including: a seating surface configured to mount a wafer; a recessed portion in the seating surface; a first vacuum suction hole in the seating surface; a second vacuum suction hole in the recessed portion, a blow hole in the recessed portion; and a protrusion in the recessed portion. The chip peeling apparatus further includes: a block portion within the housing and configured to move up and down within the housing so that the recessed portion protrudes; a vacuum suction source configured to evacuate the first vacuum suction hole and the second vacuum suction hole; a pressure detector configured to detect a degree of vacuum of the second vacuum suction hole; a pressurization source configured to send a fluid to the blow hole; a flow rate control valve; and a controller configured to determine a flow rate of the fluid to be sent to the blow hole, based on the degree of vacuum detected by the pressure detector, and control, via the flow rate control valve, the fluid sent from the pressurization source to flow at the flow rate determined by the controller, wherein the controller is configured to perform a control of sending the fluid to the blow hole while vacuuming the second vacuum suction hole.

According to embodiments of the present disclosure, a chip peeling apparatus is provided. The chip peeling apparatus includes a housing including: a seating surface configured to mount a wafer; a recessed portion in the seating surface; a first vacuum suction hole in the seating surface; a second vacuum suction hole in the recessed portion, a blow hole in the recessed portion; and a protrusion in the recessed portion. The chip peeling apparatus further includes: a vacuum suction source configured to evacuate the first vacuum suction hole and the second vacuum suction hole; a pressure detector configured to detect a degree of vacuum of the second vacuum suction hole; a pressurization source configured to send a fluid to the blow hole; a flow rate control valve; a controller configured to determine a flow rate of the fluid to be sent to the blow hole, based on the degree of vacuum detected by the pressure detector, and control, via the flow rate control valve, the fluid sent from the pressurization source to flow at the flow rate determined by the controller, wherein the controller is configured to perform a control of sending the fluid to the blow hole while vacuuming the second vacuum suction hole.

According to embodiments of the present disclosure, a chip peeling method performed by a chip peeling apparatus is provided. The chip peeling apparatus includes including a housing having a seating surface configured to mount a wafer, a recessed portion and a first vacuum suction hole in the seating surface, and a second vacuum suction hole, a blow hole, and a protrusion in the recessed portion. The chip peeling method includes: determining a flow rate of a fluid to be sent to the blow hole, based on a degree of vacuum of the second vacuum suction hole detected by a pressure detector of the chip peeling apparatus; controlling, via a flow rate control valve of the chip peeling apparatus, the fluid to be sent from a pressurization source of the chip peeling apparatus to the blow hole at the determined flow rate; and performing evacuation of the second vacuum suction hole while controlling the fluid to be sent to the blow hole at the determined flow rate, wherein the chip peeling apparatus further includes a vacuum suction source configured to evacuate the first vacuum suction hole and the second vacuum suction hole.

BRIEF DESCRIPTION OF DRAWINGS

Embodiments of the present disclosure will be more clearly understood from the following detailed description taken in conjunction with the accompanying drawings in which.

DETAILED DESCRIPTION

Hereinafter, non-limiting example embodiments of the present disclosure are described with reference to drawings.

It will be understood that when an element is referred to as being "over," "above," "on," "below," "under," "beneath," "connected to" or "coupled to" another element, it can be directly over, above, on, below, under, beneath, connected or coupled to the other element or intervening elements may be present. In contrast, when an element is referred to as being "directly over," "directly above," "directly on," "directly below," "directly under," "directly beneath," "directly connected to" or "directly coupled to" another element, there are no intervening elements present.

First Embodiment

Figure 1:
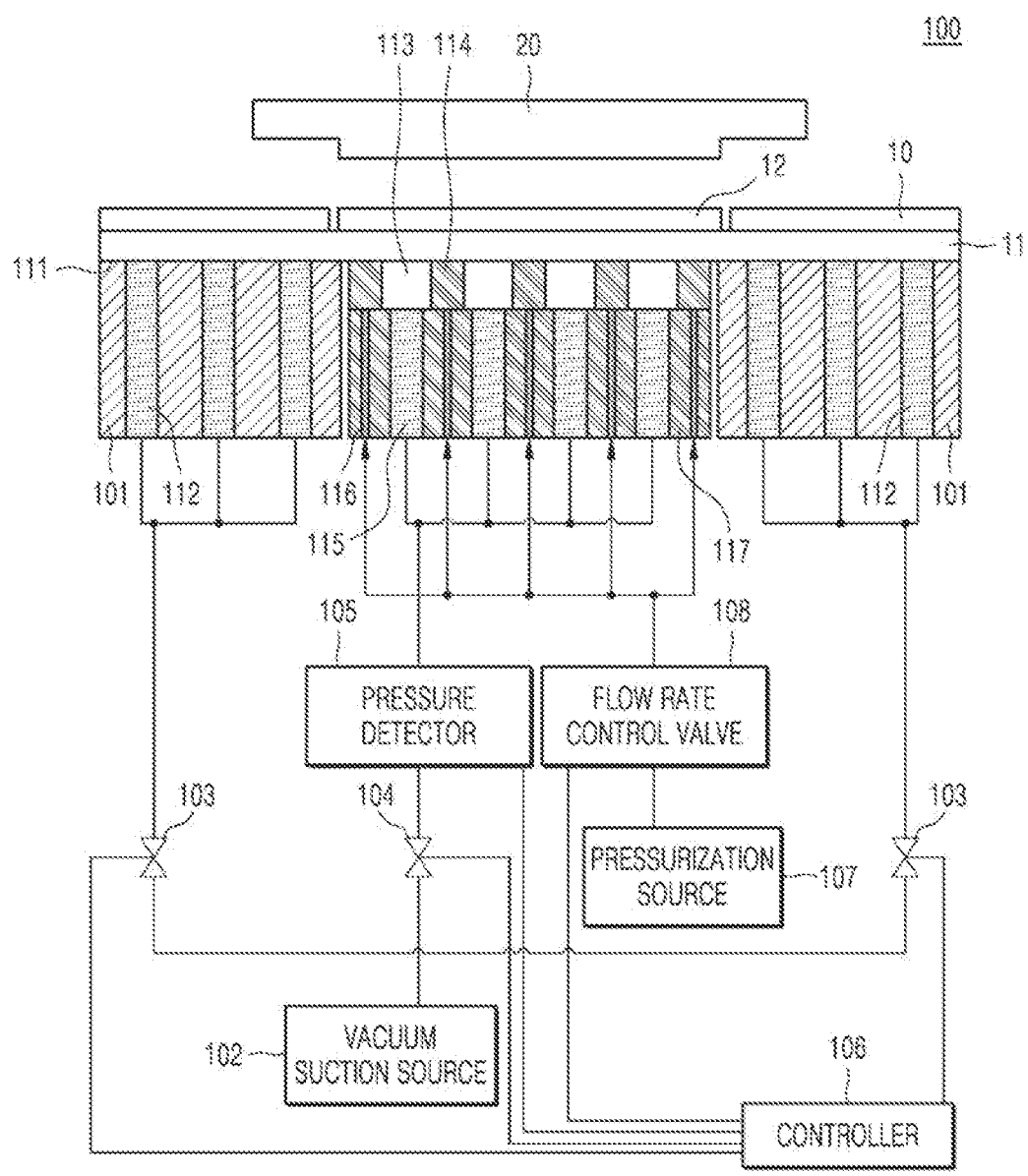
FIG. 1 is a cross-sectional view showing an example of a chip peeling apparatus according to first embodiment.

FIG. 1 is a cross-sectional view showing an example of a chip peeling apparatus according to a first embodiment. In FIG. 1, a chip peeling apparatus 100 includes a housing 101, a vacuum suction source 102, a first valve 103, a second valve 104, a pressure detector 105, a controller 106, and a pressurization source 107, and a flow rate control valve 108. A picker 20 is a structure which picks up a chip 12 from a semiconductor wafer 10 from which dicing tape 11 was peeled. In FIG. 1, the downward direction of the drawing is an example indicating the direction of gravity.

The semiconductor wafer 10 that is diced is mounted on a seating surface 111 of the housing 101. A plurality of first vacuum suction holes 112 are distributed throughout the seating surface 111 of the housing 101. In addition, in the seating surface 111, a recessed portion 113 (e.g., a recess) is provided in an area having a size of one chip.

Figure 2:
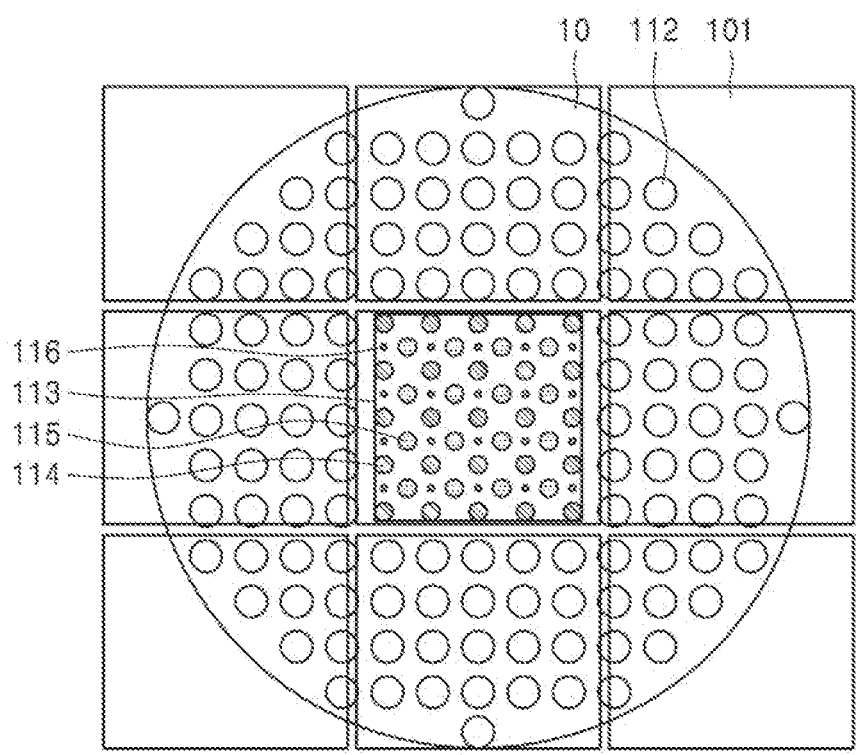
FIG. 2 is a top perspective view showing an example of the chip peeling apparatus according to the first embodiment.
Figure 3:
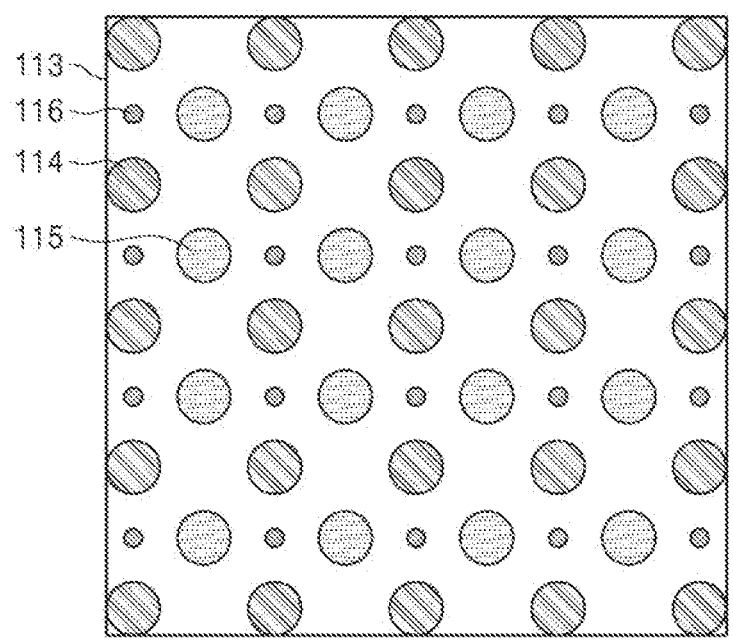
FIG. 3 is a top view showing an example of a recessed portion of the chip peeling apparatus according to the first embodiment.

FIG. 2 is a top perspective view showing an example of the chip peeling apparatus according to the first embodiment;

FIG. 3 is a top view showing an example of the recessed portion 113 of the chip peeling apparatus according to the first embodiment.

As shown in FIGS. 1 to 3, the recessed portion 113 is provided with a plurality of projections 114, a plurality of second vacuum suction holes 115, and a plurality of blow holes 116. As shown in FIG. 1, the upper end of the protrusions 114 is the same as the vertical level of the seating surface 111.

In addition, the opening area of each of the blow holes 116 is less than the opening area of each of the second vacuum suction holes 115. The occurrence of sudden pressurization may be suppressed by the relation in size between the area of the second vacuum suction holes 115 and the area of the blow holes 116.

In addition, a block portion 117 movable up and down is provided in a part of the recessed portion 113 of the housing 101. An ejector is configured by the housing 101 and the block portion 117. That is, the protrusions 114, the second vacuum suction holes 115, and the blow holes 116 are provided in the portion of the block portion 117 of the housing 101.

Returning to FIG. 1, the vacuum suction source 102 vacuums the first vacuum suction holes 112 through the first valve 103. In addition, the vacuum suction source 102 vacuums the second vacuum suction holes 115 through the second valve 104.

The first valve 103 is a stop valve provided in the middle of the pipe for connecting the first vacuum suction holes 112 and the vacuum suction source 102 to each other.

The second valve 104 is a stop valve provided in the middle of the pipe for connecting the second vacuum suction holes 115 and the vacuum suction source 102 to each other.

The pressure detector 105 detects the pressure sucked from the second vacuum suction holes 115 (that is, the pressure of a space formed by the semiconductor wafer 10 and the recessed portion 113 of the housing 101). Then, the pressure detector 105 outputs the detected pressure value to the controller 106.

The controller 106 controls the flow rate control valve 108 to adjust the flow rate, based on the pressure value detected by the pressure detector 105. In addition, the controller 106 controls opening and closing of the first valve 103 and the second valve 104. Details of the control by the controller 106 are described below.

The pressurization source 107 presses the semiconductor wafer 10 by supplying a fluid to the blow holes 116 through the flow rate control valve 108. The fluid may be a gas. According to embodiments, the fluid may be an inert gas. For example, the pressurization source 107 may be a booster pump or a gas-filled bombe.

The flow rate control valve 108 adjusts the amount of the fluid delivered from the pressurization source 107 to the blow holes 116, in response to a control command from the controller 106.

With the above configuration, the chip peeling apparatus 100 peels the dicing tape 11 from the chip 12. Next, the operation of the chip peeling apparatus 100 is described.

Figure 4:
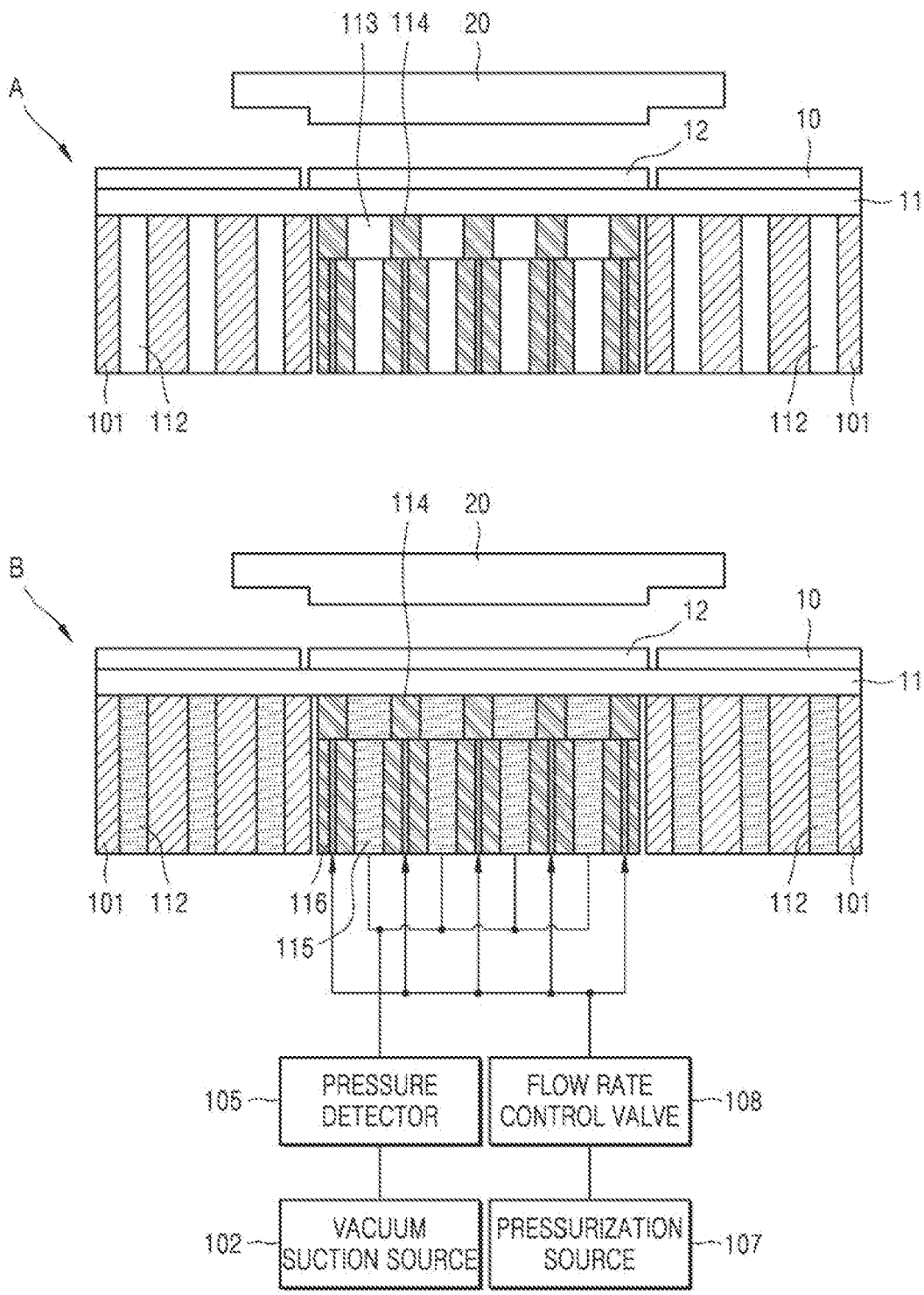
FIG. 4 is a cross-sectional view showing an example of the chip peeling apparatus according to the first embodiment.
Figure 5:
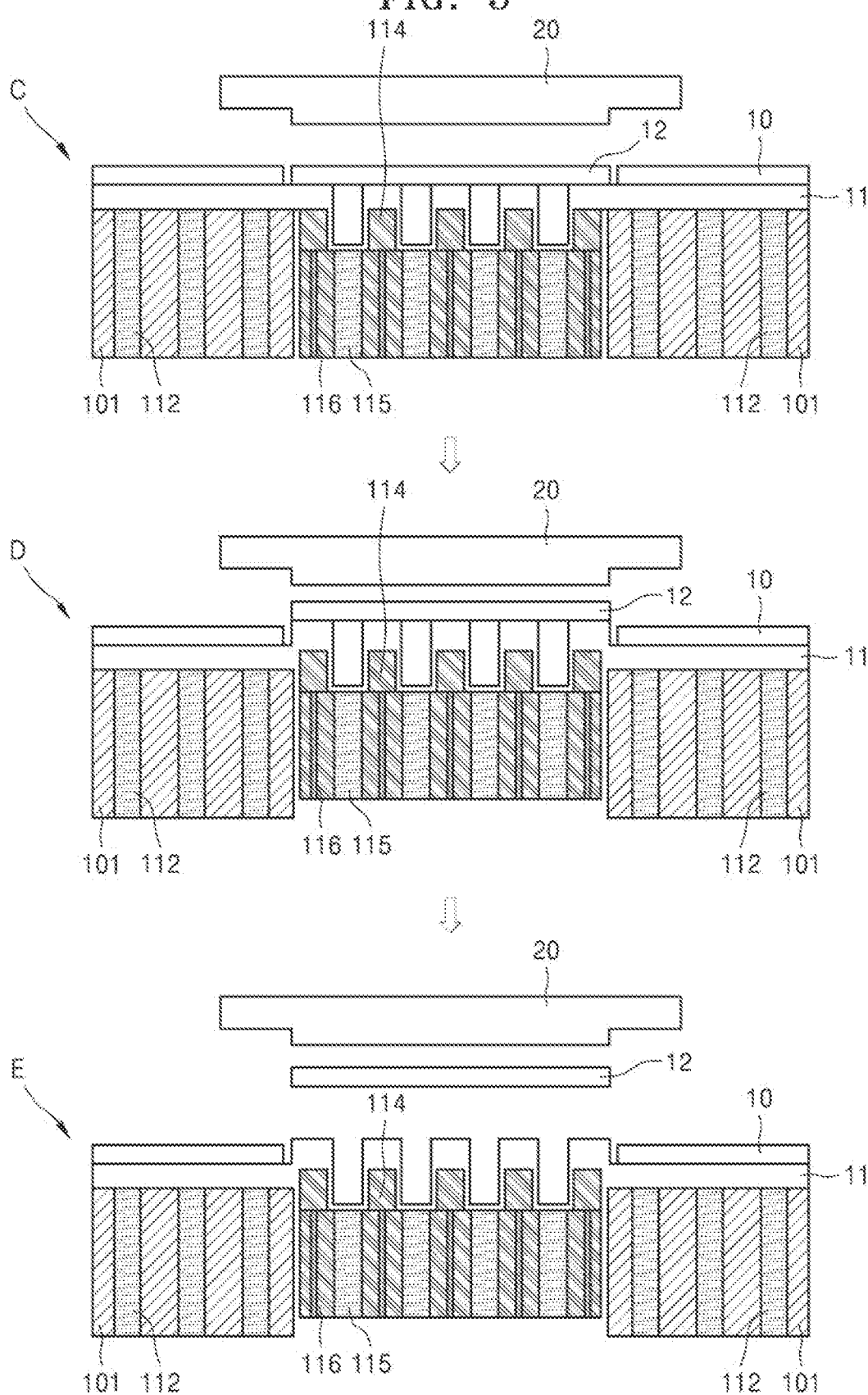
FIG. 5 is a cross-sectional view showing an example of the chip peeling apparatus according to the first embodiment.

FIGS. 4 and 5 are a cross-sectional view showing an example of the chip peeling apparatus according to the first embodiment.

Figure 6:
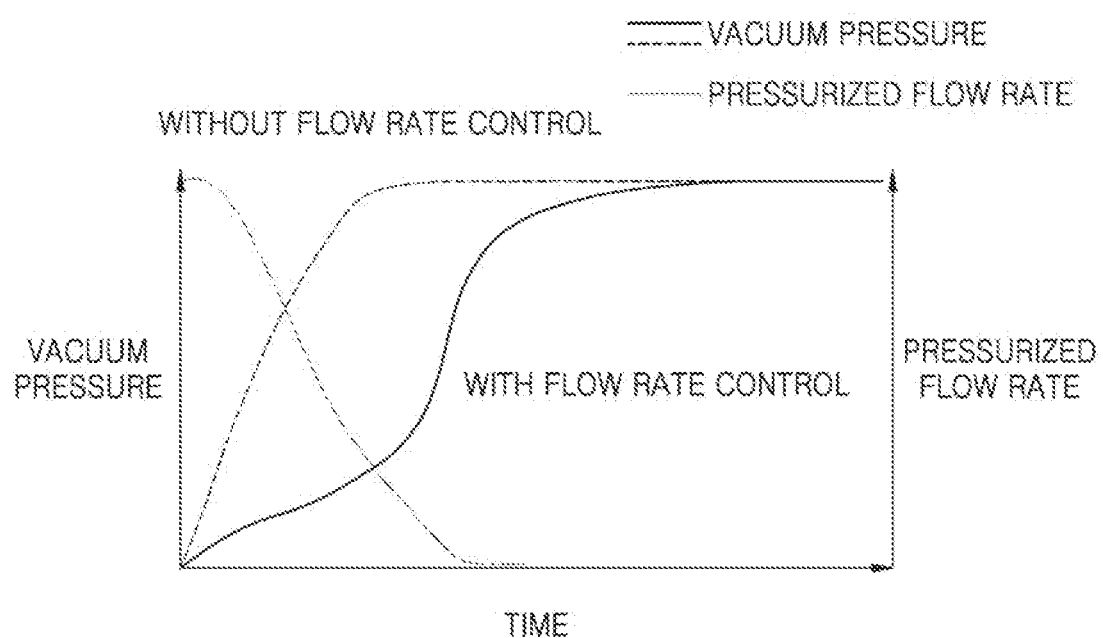
FIG. 6 is a graph comparing cases with and without flow control.

In addition, FIG. 6 is a graph comparing the cases with and without flow control. The operations described below are controlled by the controller 106.

First, as shown in sub-diagram A of FIG. 4, in the chip peeling apparatus 100 of FIG. 1, a semiconductor wafer 10 that is diced is attached to a dicing frame is seated on a housing 101 of an ejector. Peeling of the tape from the chip is performed on the ejector.

Next, while the horizontal position of the recessed portion 113 of the ejector is aligned with the chip 12 to be peeled, the height of the ejector is made equal to the height of the dicing tape 11.

Then, as shown in sub-diagram B of FIG. 4, the dicing tape 11 is vacuum-sucked by the vacuum suction source 102 of the ejector.

Then, the vacuum pressure is detected by the pressure detector 105, and the pressurized air is put into the blow holes 116 through the flow rate control valve 108 provided on the pressurization side to prevent a sudden rise in the vacuum pressure. The change of the vacuum pressure with or without flow control is shown in FIG. 6. In FIG. 6, the vertical axis represents the degree of vacuum. In addition, the horizontal axis represents time. As shown in FIG. 6, by performing control to reduce the flow rate of pressurized air with time, a sudden rise in vacuum pressure is prevented. The result of vacuum suction of the dicing tape 11 is as shown in sub-diagram C of FIG. 5.

Then, as shown in sub-diagram D of FIG. 5, the block portion 117 is raised by an actuator (not shown) or the like so as not to come into contact with an adjacent chip.

The pick-up head of the picker 20 is placed on the chip 12 and lowered to approach the chip 12, and thus, the chip 12 is suctioned by vacuum suction at a position where the suction is possible. By this operation, the chip 12 is picked up as shown in sub-diagram E of FIG. 5.

By the above operation, the chip 12 is picked up from the semiconductor wafer 10.

The recessed portion 113 of the housing 101 is provided with a protrusion 114 (or groove) that is base-shaped for vacuum suction in advance. Due to the shape of the protrusion 114, a portion in which the chip 12 and the dicing tape 11 come into contact with each other during vacuum suction may be limited to the protrusion 114. Therefore, the contact area between the chip 12 and the dicing tape 11 may be reduced to promote peeling.

For example, when a groove is formed in the center of the ejector, which is a position corresponding to the chip to be peeled, the size of the groove is less than that of the chip to be peeled, and the area of the groove may be 90% to 99% of the area of the chip.

In addition, the depth of the groove may be 100 μm to 500 μm in addition to the thickness of the dicing tape.

According to embodiments, the apex position of the protrusion 114 is movable so that the protrusion 114 may protrude from about 100 μm to about 500 μm from the housing 101 of the ejector.

The diameter of each of the first vacuum suction holes 112 and the second vacuum suction holes 115 may be about 0.5 mm. In addition, the diameter of each of the blow holes 116 for pressurization may be made much smaller than the diameter of the first vacuum suction holes 112 and the second vacuum suction holes 115. In detail, the diameter of each of the blow holes 116 may be 0.1 mm or less.

The dicing tape 11 is suctioned by performing vacuum suction by the vacuum suction source 102, and accordingly, the dicing contact area between the chip 12 and the dicing tape 11 is reduced, so that the chip 12 is peeled off from the semiconductor wafer 10.

Thus, according to the chip peeling apparatus of the first embodiment, because the pressure of vacuum suction is controlled by a pressurized flow rate, cracking and breaking may be reduced by suppressing rapid chip deformation during vacuum suction. In addition, according to the chip peeling apparatus of the first embodiment, a drive system may be downsized due to the minute driving of the block portion. In addition, according to the chip peeling apparatus of the first embodiment, because the vacuum pressure is controlled by the pressurized air, the response to the vacuum pressure control is faster than performing the control only with the vacuum valve, and thus, the peeling time may be shortened.

Second Embodiment

In a second embodiment, an example in which the portion of the recessed portion is raised in a state of only pressing is described. The configuration of the chip peeling apparatus of the second embodiment is the same as that of the chip peeling apparatus of the first embodiment, but the operation of the chip peeling apparatus of the second embodiment is different from that of the chip peeling apparatus of the first embodiment.

Figure 7:
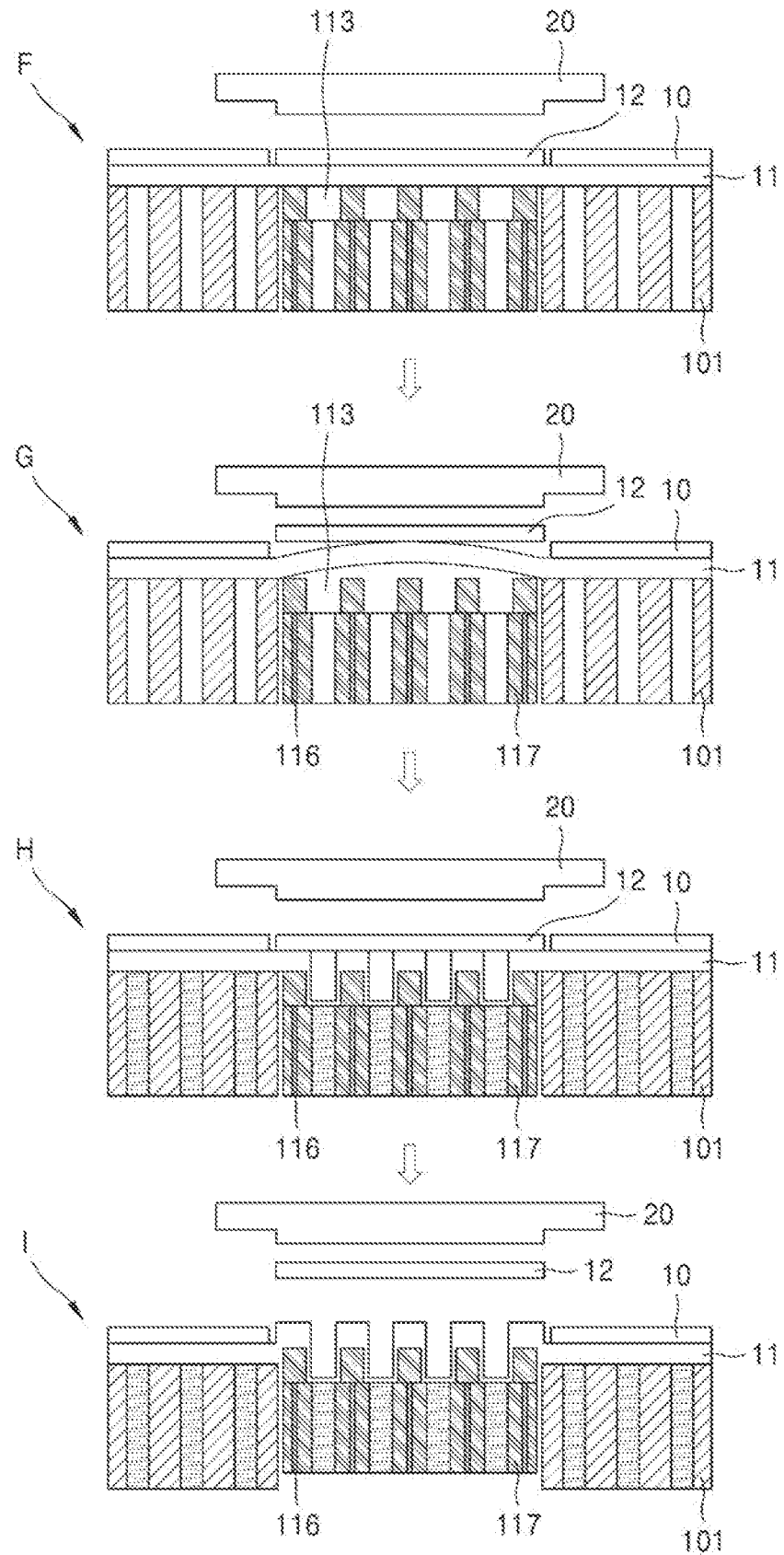
FIG. 7 is a cross-sectional view showing an example of a chip peeling apparatus according to a second embodiment.
Figure 8:
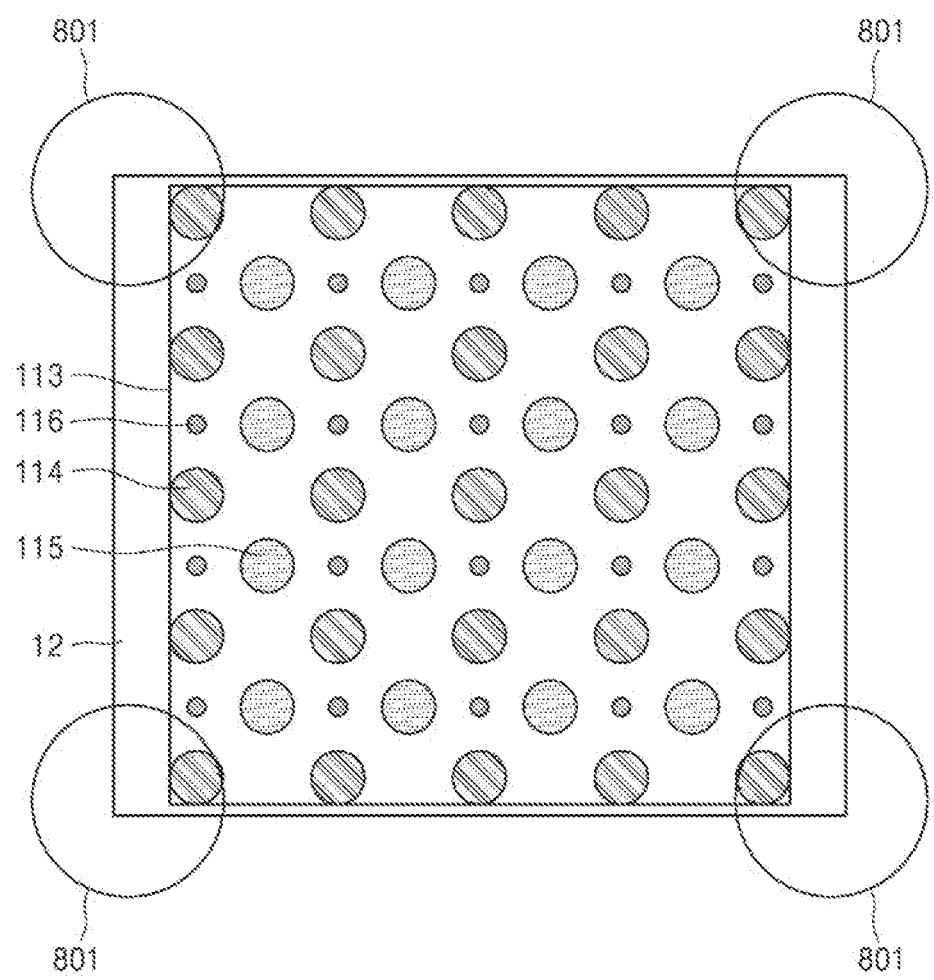
FIG. 8 is a top view for explaining peeling.

The operation of the second embodiment is described with reference to FIG. 7. FIG. 7 is a cross-sectional view showing an example of the chip peeling apparatus according to the second embodiment. In addition, FIG. 8 is a top view for explaining peeling.

First, as shown in sub-diagram F of FIG. 7, in the chip peeling apparatus 100, a semiconductor wafer 10 that is diced and attached to a dicing frame is seated on an ejector (a housing 101 of an ejector). Peeling of the dicing tape 11 from the chip 12 is performed on the ejector.

Next, with the horizontal position of the recessed portion 113 of the ejector aligned with the chip 12 to be peeled, the height of the ejector is moved to the same height as that of the dicing tape 11.

In addition, as shown in sub-diagram G of FIG. 7, while putting the pressurized air into the blow holes 116 through the flow rate control valve (flow rate control valve 108 in FIG. 1) provided on the pressurization side, the block portion 117 is raised by an actuator (not shown) or the like so as not to come into contact with an adjacent chip. By this operation, the dicing tape 11 and the chip 12 are lifted up and the dicing tape 11 is bent in a bow shape, so that the peeling of the four corners around the chip 12 is promoted. That is, peeling of the portions surrounded by circles 801 in FIG. 8 is promoted.

Then, as shown in sub-diagram H of FIG. 7, while the block portion 117 is lowered by an actuator (not shown) or the like, the dicing tape 11 is vacuum-sucked by the vacuum suction source (vacuum suction source 102 in FIG. 1) of the ejector. In addition, the vacuum pressure is detected by the pressure detector (pressure detector 105 in FIG. 1), and the pressurized air is put into the blow holes 116 through the flow rate control valve (flow rate control valve 108 in FIG. 1) provided on the pressurization side.

The pick-up head of the picker 20 is placed on the chip 12 and lowered to approach the chip 12, and thus, the chip 12 is suctioned by vacuum suction at a position where the suction is possible. By this operation, the chip 12 is picked up as shown in sub-diagram I of FIG. 7.

Thus, according to the chip peeling apparatus of the second embodiment, by pressing and raising the chip to be peeled with a fluid, peeling of the four corners around the chip may be promoted.

Third Embodiment

Figure 9:
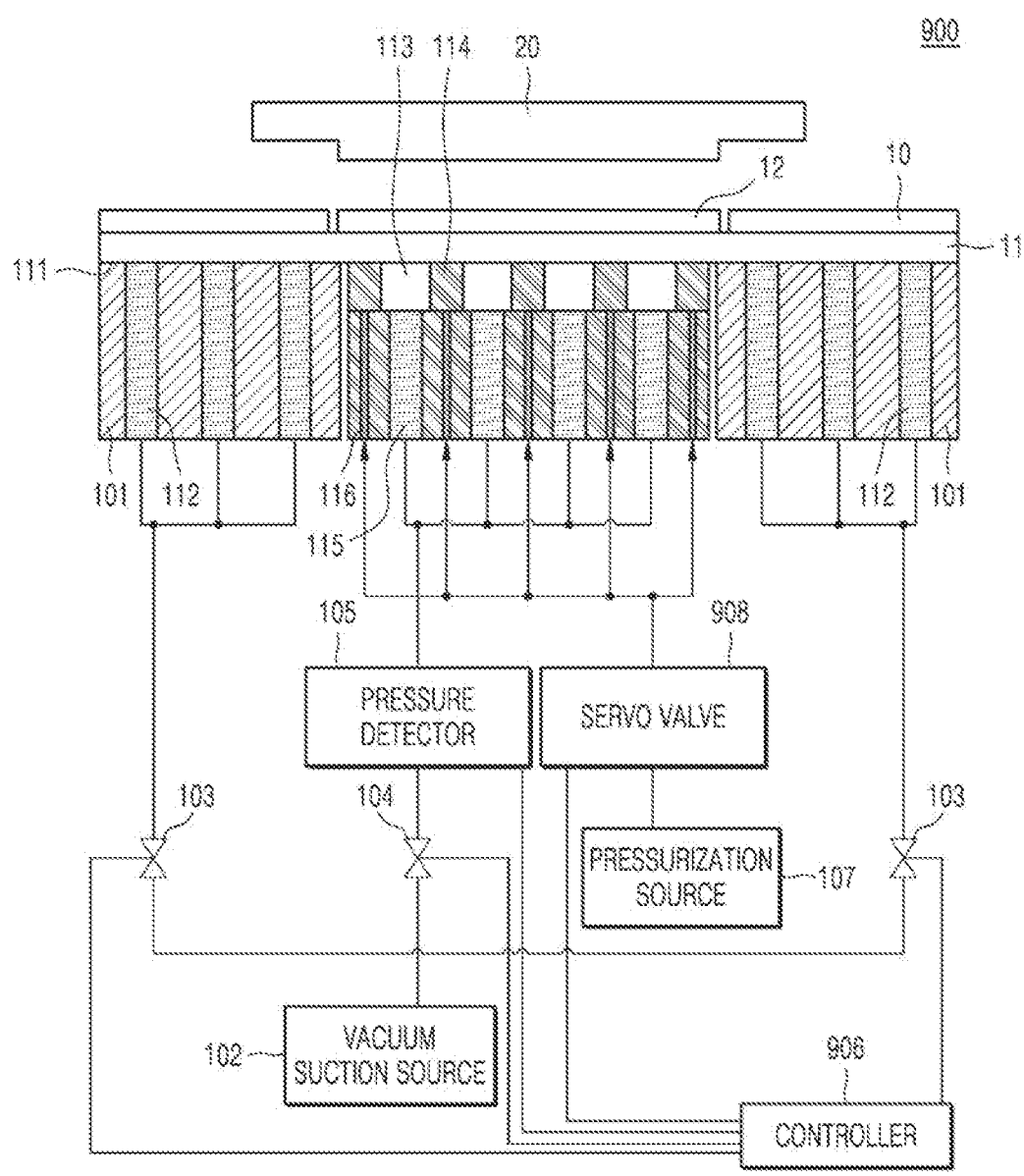
FIG. 9 is a cross-sectional view showing an example of a chip peeling apparatus according to a third embodiment.

In the third embodiment, an example in which a servo valve is provided in a flow path on the pressurization side is described. FIG. 9 is a cross-sectional view showing an example of the chip peeling apparatus according to the third embodiment.

In FIG. 9, a chip peeling apparatus 900 includes a housing 101, a vacuum suction source 102, a first valve 103, a second valve 104, a pressure detector 105, a controller 906, a pressurization source 107, and a servo valve 908. In FIG. 9, components identical to those in FIG. 1 are denoted by the same reference numerals, and descriptions thereof are omitted.

The controller 906 adjusts the flow rate in the servo valve 908, based on the pressure value detected by the pressure detector 105. In addition, the controller 906 controls opening and closing of the first valve 103 and the second valve 104. The details of the control of the controller 906 are obtained by adding the control of the servo valve 908 to the controller 106 of the first embodiment.

The servo valve 908 adjusts the amount of fluid sent from the pressurization source 107 to the blow holes 116, based on an instruction from the controller 906. In detail, the servo valve 908 periodically adjusts the amount of fluid.

Figure 10:
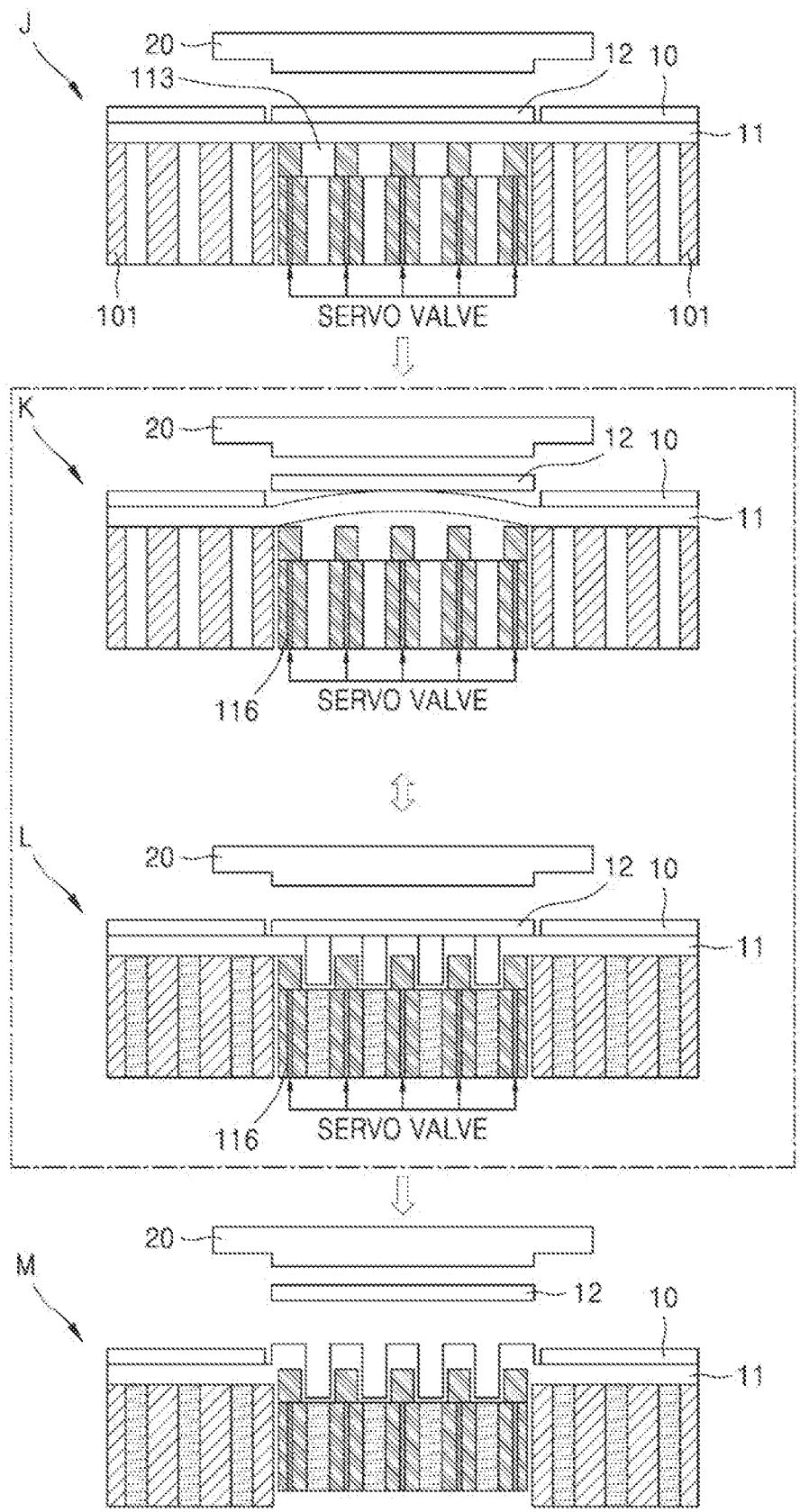
FIG. 10 is a cross-sectional view showing an example of the chip peeling apparatus according to the third embodiment.

Next, an operation of the chip peeling apparatus 900 is described. FIG. 10 is a cross-sectional view showing an example of the chip peeling apparatus according to the third embodiment. The operations described below are controlled by the controller 906.

First, as shown in sub-diagram J of FIG. 10, in the chip peeling apparatus (chip peeling apparatus 900 in FIG. 9), a semiconductor wafer 10 that is diced and attached to a dicing frame is seated on the ejector (the housing 101 of the ejector). Peeling of the dicing tape 11 from the chip 12 is performed on the ejector.

Next, with the horizontal position of the recessed portion 113 of the ejector aligned with the chip 12 to be peeled, the height of the ejector is moved to the same height as that of the dicing tape 11.

In addition, as shown in sub-diagram K of FIG. 10, the pressurized air is put into the blow holes 116 through the servo valve (servo valve 908 in FIG. 9) provided on the pressurization side.

In addition, as shown in sub-diagram L of FIG. 10, the dicing tape 11 is vacuum-sucked by the vacuum suction source (vacuum suction source 102 in FIG. 9) of the ejector.

The pressurization of sub-diagram K of FIG. 10 and the vacuum suction of sub-diagram L of FIG. 10 are alternately repeated.

Then, the pick-up head of the picker 20 is placed on the chip 12 and lowered to approach the chip 12, and thus, the chip 12 is suctioned by vacuum suction at a position where the suction is possible. By this operation, the chip 12 is picked up as shown in sub-diagram M of FIG. 10.

By the above operation, the chip 12 is picked up from the semiconductor wafer 10.

Thus, according to the chip peeling apparatus of the third embodiment, the peeling of the chip 12 may be promoted by the force of vibration while changing the cycle of pressing.

In addition, embodiments of the present disclosure are not limited to the example embodiments described above, and may be modified as appropriate in a range which does not deviate from purposes of embodiments. For example, with respect to the above example embodiments, the downward direction in the drawings is described as the direction of gravity, but another direction in the drawings may be described as the direction of gravity.

According to embodiments of the present disclosure, the controller (e.g., the controller 106 and the controller 906) may comprise at least one processor and at least one memory storing computer program instructions. The computer program instructions may be configured to, when executed by the at least one processor, cause the controller to perform its functions, including the functions described in the present disclosure.

While non-limiting example embodiments of the present disclosure have been particularly shown and described, it will be understood that various changes in form and details may be made to embodiments of the present disclosure without departing from the spirit and scope of the present disclosure.

What is claimed is:

1. A chip peeling apparatus comprising:
    a housing comprising:
        a seating surface configured to mount a wafer;
        a recessed portion in the seating surface;
        a first vacuum suction hole in the seating surface, outside of the recessed portion;
        a second vacuum suction hole in the recessed portion;
        a blow hole in the recessed portion; and
        a protrusion in the recessed portion;
    a vacuum suction source configured to evacuate the first vacuum suction hole and the second vacuum suction hole;
    a pressure detector configured to detect a degree of vacuum of the second vacuum suction hole;
    a pressurization source configured to send a fluid to the blow hole;
    a flow rate control valve; and
    a controller configured to determine a flow rate of the fluid to be sent to the blow hole, based on the degree of vacuum detected by the pressure detector, and control, via the flow rate control valve, the fluid sent from the pressurization source to flow at the flow rate determined by the controller,
    wherein the controller is configured to perform a control of sending the fluid to the blow hole while vacuuming the second vacuum suction hole.

2. The chip peeling apparatus of claim 1, wherein an opening area of the blow hole is less than an opening area of the second vacuum suction hole.

3. The chip peeling apparatus of claim 1, wherein the controller is configured to perform the control such that the flow rate of the fluid sent to the blow hole reduces with time.

4. The chip peeling apparatus of claim 1, wherein an upper end of the protrusion is at a same level as a vertical level of the seating surface.

5. The chip peeling apparatus of claim 1, wherein the chip peeling apparatus further comprises a block portion that is within the housing and configured to protrude the recessed portion.

6. The chip peeling apparatus of claim 5, wherein the block portion is configured to be moved up and down within the housing.

7. The chip peeling apparatus of claim 5, wherein the protrusion, the second vacuum suction hole, and the blow hole are in a part of the block portion.

8. The chip peeling apparatus of claim 7, wherein an apex position of the protrusion is configured to protrude 100 μm to 500 μm above the housing.

9. The chip peeling apparatus of claim 1, wherein the flow rate control valve comprises a servo valve configured to periodically change the flow rate.

10. A chip peeling apparatus comprising:
    a housing comprising:
        a seating surface configured to mount a wafer;
        a recessed portion in the seating surface;
        a first vacuum suction hole in the seating surface, outside of the recessed portion;
        a second vacuum suction hole in the recessed portion;
        a blow hole in the recessed portion; and
        a protrusion in the recessed portion;

a block portion within the housing and configured to move up and down within the housing so that the recessed portion protrudes;

a vacuum suction source configured to evacuate the first vacuum suction hole and the second vacuum suction hole;

a pressure detector configured to detect a degree of vacuum of the second vacuum suction hole;

a pressurization source configured to send a fluid to the blow hole;

a flow rate control valve; and a controller configured to determine a flow rate of the fluid to be sent to the blow hole, based on the degree of vacuum detected by the pressure detector, and control, via the flow rate control valve, the fluid sent from the pressurization source to flow at the flow rate determined by the controller, wherein the controller is configured to perform a control of sending the fluid to the blow hole while vacuuming the second vacuum suction hole.

11. The chip peeling apparatus of claim 10, wherein an upper end of the protrusion is at a same level as a vertical level of the seating surface, and an apex position of the protrusion is configured to protrude from 100 μm to 500 μm above the housing.

12. The chip peeling apparatus of claim 10, wherein an opening area of the blow hole is less than an opening area of the second vacuum suction hole.

13. The chip peeling apparatus of claim 10, wherein a diameter of the first vacuum suction hole and a diameter of the second vacuum suction hole are 0.5 mm.

14. The chip peeling apparatus of claim 10, wherein a diameter of the blow hole is 0.1 mm or less.

15. The chip peeling apparatus of claim 10, wherein the controller is configured to perform the control such that the flow rate of the fluid sent to the blow hole reduces with time.

16. The chip peeling apparatus of claim 10, wherein the flow rate control valve is a servo valve configured to periodically change the flow rate of the fluid.

17. A chip peeling apparatus comprising:
a housing comprising:
a seating surface configured to mount a wafer;
a recessed portion in the seating surface;
a first vacuum suction hole in the seating surface, outside of the recessed portion;
a second vacuum suction hole in the recessed portion,
a blow hole in the recessed portion; and
a protrusion in the recessed portion;

a vacuum suction source configured to evacuate the first vacuum suction hole and the second vacuum suction hole;

a pressure detector configured to detect a degree of vacuum of the second vacuum suction hole;

a pressurization source configured to send a fluid to the blow hole;

a servo valve; and a controller configured to determine a flow rate of the fluid to be sent to the blow hole, based on the degree of vacuum detected by the pressure detector, and control, via the servo valve, the fluid sent from the pressurization source to flow at the flow rate determined by the controller, wherein the controller is configured to perform a control of sending the fluid to the blow hole while vacuuming the second vacuum suction hole.

18. The chip peeling apparatus of claim 17, wherein an opening area of the blow hole is less than an opening area of the second vacuum suction hole.

19. The chip peeling apparatus of claim 17, wherein the chip peeling apparatus further comprises a block portion within the housing and configured to move up and down within the housing so as to protrude the recessed portion, wherein the protrusion is on the block portion, and the second vacuum suction hole and the blow hole are within the block portion.

20. The chip peeling apparatus of claim 17, wherein a diameter of the blow hole is less than a diameter of the first vacuum suction hole and a diameter of the second vacuum suction hole, and wherein the diameter of the blow hole is 0.1 mm or less.

* * * * *